April 14, 1970 YOSHIHIRO MATSUO ET AL 3,506,575
METHOD FOR MAKING SEMICONDUCTIVE PIEZOELECTRIC CERAMIC TRANSDUCERS
Filed Jan. 12, 1968
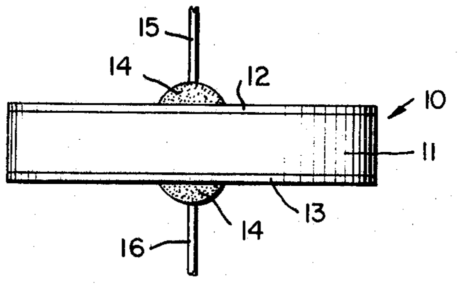
YOSHIHIRO MATSUO,
HITOSHI MATSUMOTO,
EISUKE KUROKAWA,
HIROMU SASAKI AND
SHIGERU HAYAKAWA
INVENTORS
BY Wenderoth, Lind & Ponack.
ATTORNEYS 3,506,575
Patented Apr. 14, 1970

3,506,575

METHOD FOR MAKING SEMICONDUCTIVE PIEZOELECTRIC CERAMIC TRANSDUCERS

Yoshihiro Matsuo, Hitoshi Matsumoto, Eisuke Kurokawa, Hiromu Sasaki, and Shigeru Hayakawa, Osaka, Japan, assignors to Matsushita Electric Industrial Co., Ltd., Osaka, Japan Filed Jan. 12, 1968, Ser. No. 697,462
Claims priority, application Japan, Mar. 14, 1967, 42/16,821; Mar. 23, 1967, 42/18,574
Int. Cl. C04b 35/00
U.S. Cl. 252—62.9 4 Claims

ABSTRACT OF THE DISCLOSURE

Semiconductive material which is characterized by low specific resistivity and superior electromechanical transducing properties is made by firing PbO, MgO, $Nb_2O_5$, $TiO_2$ and $ZrO_2$ in an inert or reducing atmosphere and corresponds to the formula $$Pb(Mg_{1/3}Nb_{2/3})_xTi_yZr_zO_3$$

$x+y+z$ being equal to 1. NiO is optionally included. The material is useful in making e.g. a phonograph pickup for a transistorized amplifier with low input-impedance.

The electronic industries have recently required an electromechanical transducer material having a low specific resistivity, since various electronic equipments have been transistorized. For example, a photograph pickup for a transistorized amplifier needs an electromechanical transducer element having a specific resistivity as low as $10^3$ to $10^6$ ohm-cm., because a transistorized amplifier has a low input-impedance. There has heretofore been known no ceramic electromechanical transducer material applicable to such a phonograph pickup for transistorized amplifiers.

At the present time, the phonograph pickup element for transistorized amplifiers is composed of semiconductive materials having a piezoresistive property. As a piezoresistive material, germanium or silicon single crystals of N-type or P-type semiconductor are commonly used. However, these materials show a small piezoresistive coefficient and, therefore, they exhibit a low output voltage when used in the phonograph pickup elements.

On the other hand, piezoelectric ceramic materials such as lead titanate-zirconate $Pb(Ti,Zr)O_3$, barium titanate, $BaTiO_3$, and lead magnesium niobate-titanate-zirconate, $Pb(Mg_{1/3}Nb_{2/3},Ti,Zr)O_3$, are widely used as electromechanical transducer material for phonograph pickup elements. These piezoeletric materials show superior electromechanical transducer properties and high output voltage when operated as a phonograph pickup element. However, they show a higher specific resistivity than the input-impedance of the transistorized amplifier.

The applied voltage to the input of the amplifier by the piezoelectric output voltage is substantially lowered due to the higher specific resistivity. Thus, the conventional piezoelectric ceramics as electromechanical transducer materials are not suitable for application to transistorized amplifiers.

It is well known that barium titanate becomes semiconductive when incorporated with a small amount of alkaline rare earth metal oxide or fired in a reducing gas atmosphere. However, these semiconductive barium titanate ceramic materials exhibit no piezoelectric properties and, therefore, they are not used as an electromechanical transducer material.

An object of the present invention is to provide a semiconductive piezoelectric ceramic material having a low specific resistivity and superior electromechanical transducing properties.

Another object of the present invention is to provide a method for making said material with use of atmospheric firing.

A further object of the present invention is to provide a method for making an electromechanical transducer comprising said material.

A still further object of the present invention is to increase the electromechanical coupling coefficient of said material modified by addition of nickel oxide.

These and other objects of the present invention will be apparent upon consideration of the following description taken together with the accompanying drawing in which the single figure is a perspective view of a transducer comprising a ceramic body according to the present invention.

Before proceeding with a detailed description of the semiconductive piezoelectric ceramic materials contemplated by the invention, their application is electromechanical transducers will be described with reference to the aforesaid drawing wherein reference character 10 designates, as a whole, an electromechanical transducer having, as its active element, a preferably disc shaped body 11 of semiconductive piezoelectric ceramic material according to the present invention.

Body 11 is electrically polarized, in a manner hereinafter set forth, and is provided with a pair of electrodes 12 and 13, applied in a suitable and per se conventional manner, on two opposite surfaces thereof. Lead wires 15 and 16 are attached to the electrodes 12 and 13 respectively by means of solder 14. When the ceramic body is subjected to shock, vibration, of other mechanical stress, electrical output generated can be taken from the lead wires 15 and 16.

The scope of the present invention will be understood more clearly upon consideration of the following description with reference to examples according to the invention.

The raw materials, PbO, MgO, $Nb_2O_5$, $TiO_2$, and $ZrO_2$ and with or without NiO are used in amounts based on the compositions given in Table I where the compositions are expressed by the chemical formula $$Pb(Mg_{1/2}Nb_{2/3})_xTi_yZr_zO_3$$

$(x+y+z=1)$. They are intimately mixed in a ball-mill using an appropriate amount of water. After mixing and drying, the mixture is pressed into desired forms, for example, pellets of 50 mm. diameter and 30 mm. thickness under any suitable pressure, for example, 300 kg. per cm.$^2$. The pressed pellets are calcined at any suitable temperature, for example, at 850° C. for 2 hours in air. The calcined pellets are crushed by ball-milling. After crushing and drying, small amount of any suitable binder such as polyvinyl alcohol (PVA) is added to the calcined powders. The PVA-added powders are pressed into desired form, for example, pellets of 20 mm. diameter and 2 mm. thickness under any suitable pressure, for example, 700 k. per cm.$^2$.

The pressed pellets are fired in an oxygen-deficient gas atmosphere consisting of flowing nitrogen, argon, hydrogen, or a mixture thereof at 1100 to 1350° C. for a time period of 10 minutes to 5 hours in accordance with the present invention. The firing is carried out under any suitable condition, for example, at the heat-up and cooling rate of 200° C. per hour. During the heat-up, soaking and cooling process, the atmosphere surrounding the pellets is established by flowing an oxygen-deficient gas selected from nitrogen, argon, hydrogen, or a mixture thereof. By "oxygen-deficient atmosphere" is meant an atmosphere containing substantially less oxygen than air under normal atmospheric pressure. The flowing rate ranges from 20 to 200 milliliters per minute. The compositions and the firing atmospheres are given in Table I.

Thus obtained solid solution ceramic body of the composition $Pb(Mg_{1/3}Nb_{2/3})_xTi_yZr_zO_3$ with or without NiO is polished down to 1 mm. in thickness and electroded by silver paint. The silver electroded ceramic body is polarized by pulsing of a DC (direct current) field of 40 kv. (kilovolts) per cm. preventing heat generation.

TABLE II

| Sample No. | Radial coupling coefficient (percent) | Dielectric constant | Dielectric loss factor | Specific resistivity (ohm-cm) |
|---|---|---|---|---|
| 1 | 10.1 | 500 | 0.05 | $7\times10^8$ |
| 2 | 15.8 | 2,000 | 0.09 | $9\times10^7$ |
| 3-1 | 20.4 | 4,700 | 0.12 | $5\times10^7$ |
| 4-1 | 31.7 | 7,900 | 0.23 | $7\times10^5$ |
| 4-2 | 29.5 | 7,300 | 0.22 | $2\times10^6$ |
| 5-1 | 32.3 | 6,200 | 0.15 | $3\times10^6$ |
| 5-2 | 30.2 | 8,500 | 0.25 | $1\times10^5$ |
| 6-1 | 31.5 | 6,200 | 0.28 | $2\times10^6$ |
| 6-2 | 28.5 | 7,500 | 0.35 | $8\times10^4$ |
| 7-1 | 40.0 | 4,600 | 0.38 | $9\times10^5$ |
| 7-2 | 43.5 | 4,800 | 0.23 | $1\times10^6$ |
| 7-3 | 41.0 | 13,000 | 0.47 | $1\times10^4$ |
| 7-4 | 45.9 | 6,300 | 0.20 | $5\times10^6$ |
| 7-5 | 42.1 | 12,000 | 0.44 | $2\times10^4$ |
| 8 | 35.6 | 8,100 | 0.36 | $1\times10^6$ |
| 9 | 33.1 | 8,700 | 0.40 | $1\times10^6$ |
| 10-1 | 29.0 | 5,200 | 0.39 | $4\times10^5$ |
| 11-1 | 58.5 | 1,900 | 0.025 | $4\times10^6$ |
| 11-2 | 57.8 | 3,600 | 0.15 | $1\times10^6$ |
| 11-3 | 45.6 | 12,000 | 0.39 | $3\times10^5$ |
| 11-4 | 39.1 | 18,000 | 0.45 | $2\times10^4$ |
| 11-5 | 31.5 | 22,000 | 0.59 | $2\times10^3$ |
| 11-6 | 58.5 | 1,900 | 0.035 | $7\times10^6$ |
| 11-7 | 65.0 | 4,000 | 0.10 | $1\times10^6$ |
| 11-8 | 45.0 | 11,000 | 0.35 | $8\times10^5$ |
| 11-9 | 42.0 | 21,000 | 0.58 | $1\times10^3$ |
| 11-10 | 55.2 | 4,100 | 0.18 | $7\times10^6$ |
| 12-1 | 35.0 | 3,200 | 0.35 | $9\times10^6$ |
| 12-2 | 28.0 | 6,800 | 0.42 | $6\times10^5$ |
| 12-3 | 24.0 | 9,200 | 0.54 | $2\times10^3$ |
| 12-4 | 39.0 | 3,100 | 0.33 | $1\times10^7$ |
| 12-5 | 41.0 | 4,000 | 0.37 | $5\times10^6$ |
| 13-1 | 32.0 | 5,200 | 0.37 | $1\times10^6$ |
| 13-2 | 39.0 | 8,700 | 0.51 | $3\times10^5$ |
| 14 | 30.5 | 4,900 | 0.54 | $1\times10^5$ |
| 15 | 27.0 | 4,100 | 0.13 | $2\times10^7$ |
| 16-1 | 49.0 | 900 | 0.018 | $1\times10^{11}$ |
| 16-2 | 48.0 | 880 | 0.018 | $2\times10^{11}$ |

TABLE I

| Sample No. | Compositions: $PbMg_{1/3}Nb_{2/3}O_3$ x | Compositions: $PbTiO_3$ y | Compositions: $PbZrO_3$ z | Additives | Addition amount (wt. percent) | Firing atmosphere: Flowing gas | Firing atmosphere: Flowing rate (ml./min.) |
|---|---|---|---|---|---|---|---|
| 1 | 1.00 | 0.00 | 0.00 | None | 0 | 95% $N_2$+5% $H_2$ | 20 |
| 2 | 0.90 | 0.10 | 0.00 | do | 0 | 95% $N_2$+5% $H_2$ | 20 |
| 3-1 | 0.80 | 0.20 | 0.00 | do | 0 | 95% $N_2$+5% $H_2$ | 20 |
| 4-1 | 0.79 | 0.20 | 0.01 | do | 0 | 95% $N_2$+5% $H_2$ | 20 |
| 4-2 | 0.79 | 0.20 | 0.01 | do | 0 | 80% $N_2$+20% $H_2$ | 20 |
| 5-1 | 0.69 | 0.30 | 0.01 | do | 0 | 95% $N_2$+5% $H_2$ | 20 |
| 5-2 | 0.69 | 0.30 | 0.01 | do | 0 | 80% $N_2$+20% $H_2$ | 20 |
| 6-1 | 0.58 | 0.41 | 0.01 | do | 0 | 95% $N_2$+5% $H_2$ | 20 |
| 6-2 | 0.58 | 0.41 | 0.01 | do | 0 | 80% $N_2$+20% $H_2$ | 20 |
| 7-1 | 0.50 | 0.375 | 0.125 | do | 0 | 95% $N_2$+5% $H_2$ | 20 |
| 7-2 | 0.50 | 0.375 | 0.125 | NiO | 0 | $N_2$ | 20 |
| 7-3 | 0.50 | 0.375 | 0.125 | NiO | 0 | 95% $N_2$+5% $H_2$ | 20 |
| 7-4 | 0.50 | 0.375 | 0.125 | NiO | 0 | $N_2$ | 20 |
| 7-5 | 0.50 | 0.375 | 0.125 | NiO | 0 | 95% $N_2$+5% $H_2$ | 20 |
| 8 | 0.49 | 0.50 | 0.01 | None | 0 | 95% $N_2$+5% $H_2$ | 20 |
| 9 | 0.49 | 0.30 | 0.21 | do | 0 | 95% $N_2$+5% $H_2$ | 20 |
| 10-1 | 0.4375 | 0.4375 | 0.125 | do | 0 | $N_2$ | 200 |
| 11-1 | 0.375 | 0.375 | 0.25 | do | 0 | $N_2$ | 20 |
| 11-2 | 0.375 | 0.375 | 0.25 | do | 0 | $N_2$ | 50 |
| 11-3 | 0.375 | 0.375 | 0.25 | do | 0 | $N_2$ | 200 |
| 11-4 | 0.375 | 0.375 | 0.25 | do | 0 | 95% $N_2$+5% $H_2$ | 50 |
| 11-5 | 0.375 | 0.375 | 0.25 | do | 0 | 80% $N_2$+20% $H_2$ | 20 |
| 11-6 | 0.375 | 0.375 | 0.25 | NiO | 0.3 | $N_2$ | 50 |
| 11-7 | 0.375 | 0.375 | 0.25 | NiO | 1.0 | $N_2$ | 50 |
| 11-8 | 0.375 | 0.375 | 0.25 | NiO | 1.0 | 95% $N_2$+5% H2 | 50 |
| 11-9 | 0.375 | 0.375 | 0.25 | NiO | 1.0 | 80% $N_2$+20% $H_2$ | 20 |
| 11-10 | 0.375 | 0.375 | 0.25 | NiO | 1.0 | Ar | 50 |
| 12-1 | 0.125 | 0.435 | 0.44 | None | 0 | $N_2$ | 200 |
| 12-2 | 0.125 | 0.435 | 0.44 | do | 0 | 95% $N_2$+5% $H_2$ | 50 |
| 12-3 | 0.125 | 0.435 | 0.44 | do | 0 | 60% $N_2$+40% $H_2$ | 20 |
| 12-4 | 0.125 | 0.435 | 0.44 | NiO | 0.3 | $N_2$ | 200 |
| 12-5 | 0.125 | 0.435 | 0.44 | NiO | 1.0 | $N_2$ | 200 |
| 13-1 | 0.063 | 0.52 | 0.417 | None | 0 | 95% $N_2$+5% $H_2$ | 50 |
| 13-2 | 0.063 | 0.52 | 0.417 | do | 0 | 80% $N_2$+20% $H_2$ | 20 |
| 14 | 0.063 | 0.30 | 0.637 | do | 0 | 80% $N_2$+20% $H_2$ | 20 |
| 15 | 0.01 | 0.46 | 0.53 | do | 0 | 80% $N_2$+20% $H_2$ | 20 |
| 16-1 | 0.00 | 0.47 | 0.53 | do | 0 | $N_2$ | 200 |
| 16-2 | 0.00 | 0.47 | 0.53 | do | 0 | 60% $N_2$+40% $H_2$ | 20 |

Some compositions investigated do not exhibit high piezoelectricity and many are electromechanically active only to a slight degree. The present invention is concerned only with those compositions exhibiting piezoelectric response of appreciable magnitude. As a matter of convenience, the radial coupling, Kr (also known as planar coupling Kp and disc coupling, K disc) by the IRE method, of the test body is taken as a measure of piezoelectric activity for the transducer material. The piezoelectric and dielectric properties and specific resistivity of the ceramic body investigated are given in Table II.

As shown in the Table II, the lead titanate-zirconate solid solution ceramics with the composition $$PbTi_{0.47}Zr_{0.53}O_3$$

show specific resistivity as high as about $10^{11}$ ohm-cm. (samples Nos. 16-1 and 16-2).

On the other hand, the solid solution ceramics of the composition $Pb(Mg_{1/3}Nb_{2/3})_xTi_yZr_zO_3$ $(x+y+z=1)$ with or without NiO prepared by the present novel atmosphere firing show a lower specific resistivity. More preferable compositions having a lower specific resistivity are listed in the Table III with reference to said chemical formula, $Pb(Mg_{1/3}Nb_{2/3})_xTi_yZr_zO_3$ in accordance with the invention.

TABLE III

Compositions:

| | |
|---|---|
| $x(PbMg_{1/3}Nb_{2/3}O_3)$ | 0.063–0.79 |
| $y(PbTiO_3)$ | 0.2–0.52 |
| $z(PbZrO_3)$ | 0.01–0.637 |

The specific resistivity in the order of $10^3$–$10^6$ Ω-cm. can be obtained by the atmosphere firing of the composition ceramics listed in the Table III. In particular, the sample 11-1 comprising $$Pb(Mg_{1/3}Nb_{2/3})_{0.375}Ti_{0.375}Zr_{0.25}O_3$$

fired in nitrogen atmosphere at the flowing rate of 20 milliliters per minute gives a specific resistivity of $4\times10^6$ ohm-cm., a radial coupling coefficient of 58.5%, and a dielectric constant of 1,900, and the sample 11–4 comprising $Pb(Mg_{1/3}Nb_{2/3})_{0.375}Ti_{0.375}Zr_{0.25}O_3$ fired in a mixed gas atmosphere of 95% nitrogen and 5% hydrogen at the flowing rate of 20 milliliters per minute gives $2\times10^4$ ohm-cm., 39.1%, and 1,800, respectively.

Further, according to the present invention, said semiconductive piezoelectric ceramic materials are improved in radial coupling coefficient by an addition of NiO to said composition, $Pb(Mg_{1/3}Nb_{2/3})_xTi_yZr_zO_3$. The preferable weight percent of said additive is 0.3–1.0 weight percent of NiO to said composition.

These improvements are summarized in Table IV with reference to the data of Table I and Table II.

TABLE IV

| Compositions | Firing Atmosphere | | NiO addition (wt. percent) | Radial coupling coefficient (percent) |
|---|---|---|---|---|
| | Flowing gas | Flowing rate (ml./min.) | | |
| $Pb(Mg_{1/3}Nb_{2/3})_{0.125}Ti_{0.435}Zr_{0.44}O_3$ | $N_2$ | 200 | 0 | 35.0 |
| $Pb(Mg_{1/3}Nb_{2/3})_{0.125}Ti_{0.435}Zr_{0.44}O_3$ | $N_2$ | 200 | 0.3 | 39.0 |
| $Pb(Mg_{1/3}Nb_{2/3})_{0.125}Ti_{0.435}Zr_{0.44}O_3$ | $N_2$ | 200 | 1.0 | 41.0 |
| $Pb(Mg_{1/3}Nb_{2/3})_{0.375}Ti_{0.375}Zr_{0.25}O_3$ | $N_2$ | 50 | 0 | 57.8 |
| $Pb(Mg_{1/3}Nb_{2/3})_{0.375}Ti_{0.375}Zr_{0.25}O_3$ | $N_2$ | 50 | 0.3 | 58.5 |
| $Pb(Mg_{1/3}Nb_{2/3})_{0.375}Ti_{0.375}Zr_{0.25}O_3$ | $N_2$ | 50 | 1.0 | 65.0 |
| $Pb(Mg_{1/3}Nb_{2/3})_{0.375}Ti_{0.375}Zr_{0.25}O_3$ | 95% $N_2$+5% $H_2$ | 50 | 0 | 39.1 |
| $Pb(Mg_{1/3}Nb_{2/3})_{0.375}Ti_{0.375}Zr_{0.25}O_3$ | 95% $N_2$+5% $H_2$ | 50 | 1.0 | 45.0 |
| $Pb(Mg_{1/3}Nb_{2/3})_{0.375}Ti_{0.375}Zr_{0.25}O_3$ | 80% $N_2$+20% $H_2$ | 20 | 0 | 31.5 |
| $Pb(Mg_{1/3}Nb_{2/3})_{0.375}Ti_{0.375}Zr_{0.25}O_3$ | 80% $N_2$+20% $H_2$ | 20 | 1.0 | 42.0 |
| $Pb(Mg_{1/3}Nb_{2/3})_{0.50}Ti_{0.375}Zr_{0.125}O_3$ | $N_2$ | 20 | 0.3 | 43.5 |
| $Pb(Mg_{1/3}Nb_{2/3})_{0.50}Ti_{0.375}Zr_{0.125}O_3$ | $N_2$ | 20 | 1.0 | 45.9 |
| $Pb(Mg_{1/3}Nb_{2/3})_{0.50}Ti_{0.375}Zr_{0.125}O_3$ | 95% $N_2$+5% $H_2$ | 20 | 0 | 40.0 |
| $Pb(Mg_{1/3}Nb_{2/3})_{0.50}Ti_{0.375}Zr_{0.125}O_3$ | 95% $N_2$+5% $H_2$ | 20 | 0.3 | 41.0 |
| $Pb(Mg_{1/3}Nb_{2/3})_{0.50}Ti_{0.375}Zr_{0.125}O_3$ | 95% $N_2$+5% $H_2$ | 20 | 1.0 | 42.1 |

While there have been described presently preferred illustrative examples of this invention, various changes and modifications can be made therein without departing from the invention, and it is intended, therefore, to cover in the appended claims all such changes and modifications as fall with the true spirit and scope of the invention.

What is claimed is:

1. A method of preparing a semiconductive piezoelectric ceramic material consisting essentially of $$Pb(Mg_{1/3}Nb_{2/3})_xTi_yZr_zO_3$$

where $x+y+z=1$ and $x$ ranges from 0.063 to 0.79, $y$ from 0.2 to 0.52, and $z$ from 0.01 to 0.637, which comprises firing a corresponding mixture of PbO, MgO, $Nb_2O_5$, $TiO_2$ and $ZrO_2$ at a temperature of 1100 to 1350° C. for a time period of 10 minutes to 5 hours in a reducing and/or inert atmosphere.

2. A method of preparing a semiconductive piezoelectric ceramic material consisting essentially of $$Pb(Mg_{1/3}Nb_{2/3})_xTi_yZr_zO_3$$

where $x+y+z=1$ and $x$ ranges from 0.063 to 0.79, $y$ from 0.2 to 0.52, and $z$ from 0.01 to 0.637, which comprises firing a corresponding mixture of PbO, MgO, $Nb_2O_5$, $TiO_2$ and $ZrO_2$ at a temperature of 1100 to 1350° C. for a time period of 10 minutes to 5 hours in a gaseous atmosphere consisting essentially of a member selected from the group consisting of nitrogen, argon, hydrogen and mixtures thereof.

3. A method according to claim 1 of preparing a semiconductive piezoelectric ceramic body, the starting mixture further containing NiO ranging from 0.3 to 1.0 percent by weight.

4. A method according to claim 3 in which $x$ ranges from 0.125 to 0.50, $y$ from 0.375 to 0.435, $z$ from 0.125 to 0.44.

References Cited

UNITED STATES PATENTS 3,268,453 8/1966 Ouchi et al. ________ 252—62.9

OTHER REFERENCES

Gerson et al., "J. Phys. Chem. Solids," vol. 24, pp. 979–84 (1963).

TOBIAS E. LEVOW, Primary Examiner

J. COOPER, Assistant Examiner

U.S. Cl. X.R.

106—39; 252—62.3, 520, 521